(12) United States Patent
Lee

(10) Patent No.: US 11,675,399 B1
(45) Date of Patent: Jun. 13, 2023

(54) FIXING DEVICE FOR FIXING AN EXPANSION CARD IN AN ELECTRONIC DEVICE

(71) Applicant: Primax Electronics Ltd., Taipei (TW)

(72) Inventor: Rong-Fu Lee, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 17/692,272

(22) Filed: Mar. 11, 2022

(30) Foreign Application Priority Data

Jan. 4, 2022 (TW) .................................. 111100228

(51) Int. Cl.
*G06F 1/18* (2006.01)
(52) U.S. Cl.
CPC .................................. *G06F 1/186* (2013.01)
(58) Field of Classification Search
CPC ........ G06F 1/185; G06F 1/186; H05K 7/1461
See application file for complete search history.

(56) References Cited

U.S. PATENT DOCUMENTS 7,149,094 B2 * 12/2006 Li ........................ H05K 7/142
 361/801
9,461,382 B2 * 10/2016 Zhu ........................ G06F 1/185

* cited by examiner

*Primary Examiner* — James Wu
(74) *Attorney, Agent, or Firm* — Kirton McConkie; Evan R. Witt

(57) ABSTRACT

A fixing device is provided for fixing an expansion card in an electronic device. The fixing device includes a supporting base, a fastening element and an actuating element. The supporting base includes a sliding rail. The sliding rail is located under the expansion card. The sliding rail includes plural first positioning structures. The fastening element includes a sliding part and a locking part. The sliding part is movably installed on the sliding rail. The locking part is protruded from the sliding part. The expansion card is arranged between the locking part and an expansion port of the electronic device. The actuating element includes a pressing part and an elastic part. The pressing part is connected with the sliding part through the elastic part. The pressing part includes a second positioning structure. The second positioning structure is detachably engaged with one of the plural first positioning structures.

7 Claims, 7 Drawing Sheets

FIXING DEVICE FOR FIXING AN EXPANSION CARD IN AN ELECTRONIC DEVICE

FIELD OF THE INVENTION

The present invention relates to a fixing device, and more particularly to a fixing device for fixing an expansion card in an electronic device.

BACKGROUND OF THE INVENTION

Generally, a circuit board of an electronic device is usually equipped with plural expansion ports. For meeting the use requirements of the user, plural expansion cards can be plugged into the corresponding expansion ports by the user. Consequently, the performance of the electronic device is enhanced.

The expansion card is usually inserted into an expansion port in a direction parallel with the circuit board. After a screw is penetrated through an end of the expansion card and tightened into a fixing hole of a circuit board, the expansion card is fixed on the circuit board. As known, the specifications of the expansion cards are diverse. In addition, the lengths of different expansion cards are usually different. For example, the common specifications of the expansion cards include 2230 (30 mm), 2242 (42 mm), 2260 (60 mm), 2280 (80 mm), 22110 (110 mm), and so on. For complying the expansion cards of different specifications, the circuit board is usually equipped with plural fixing holes in order to fix expansion cards with various lengths. Since the expansion card is fixed through the screw, the operating convenience is low. Moreover, since too many fixing holes are retained in the circuit board, the layout space for installing other circuitry structures is reduced. In other words, the circuitry layout difficulty is increased.

Therefore, there is a need of providing a fixing device in order to overcome the drawbacks of the conventional technologies.

SUMMARY OF THE INVENTION

The present invention provides a fixing device. An expansion card with a diversified size can be easily and quickly fixed in the electronic device through the fixing device. The structure of the fixing device is simple. As a consequence, the problems of using screws to fix the expansion card can be overcome.

The other objects and advantages of the present invention will be understood from the disclosed technical features.

In accordance with an aspect of the present invention, a fixing device is provided for fixing an expansion card in an electronic device. The electronic device includes an expansion port. The fixing device includes a supporting base, a fastening element and an actuating element. The supporting base is used for supporting the expansion card. The supporting base includes a sliding rail. The sliding rail is located under the expansion card. The sliding rail includes plural first positioning structures. The fastening element includes a sliding part and a locking part. The sliding part is movably installed on the sliding rail. The sliding part has a first side and a second side opposite to the first side. The locking part is protruded from the first side of the sliding part. The expansion card is arranged between the locking part and the expansion port. The actuating element includes a pressing part and an elastic part. The pressing part is connected with the sliding part through the elastic part. The pressing part is aligned with the second side of the sliding part. The pressing part includes at least one second positioning structure. As the pressing part is moved, the sliding part is correspondingly slid along the sliding rail and relative to the supporting base in a direction toward or away from the expansion port. As the sliding part is slid, the locking part is correspondingly slid between plural positions. The pressing part is permitted to be swung relative to the sliding part through the elastic part. The at least one second positioning structure is detachably engaged with one of the plural first positioning structures. Consequently, the locking part is positioned at one of the plural positions.

In an embodiment, the supporting base further includes a supporting surface. The expansion card is supported on the supporting surface. The sliding rail and the supporting surface are located beside each other.

In an embodiment, the fastening element further includes a first guiding recess and a second guiding recess, and the sliding part further has a third side and a fourth side. The third side and the fourth side are opposed to each other, and the third side and the fourth side are arranged between the first side and the second side. The first guiding recess is formed in the third side of the sliding part. A first lateral structure of the sliding rail is accommodated within the first guiding recess. The second guiding recess is formed in the fourth side of the sliding part. A second lateral structure of the sliding rail is accommodated within the second guiding recess. The sliding part is movable along the sliding rail and relative to the supporting base in the direction toward or away from the expansion port through guidance of the first guiding recess and the second guiding recess.

In an embodiment, the fastening element further includes a first engaging recess and a second engaging recess, and the elastic part of the actuating element includes a first resilient arm and a second resilience arm. The first engaging recess is concavely formed in the third side of the sliding part. The second engaging recess is concavely formed in the fourth side of the sliding part. The first resilient arm is protruded from a first end of the pressing part and extended in a direction toward the sliding part. A first tenon of the first resilient arm is engaged with the first engaging recess. The second resilience arm is protruded from a second end of the pressing part and extended in the direction toward the sliding part. A second tenon of the second resilience arm is engaged with the second engaging recess.

In an embodiment, the fastening element further includes a first position-limiting structure and a second position-limiting structure. The first position-limiting structure is protruded from a first end of the second side of the sliding part and extended in a direction toward the pressing part. The first position-limiting structure is located under the first resilient arm. The second position-limiting structure is protruded from a second end of the second side of the sliding part and extended in the direction toward the pressing part. The second position-limiting structure is located under the second resilience arm.

In an embodiment, there is a gap between the first position-limiting structure and the first resilient arm, and there is another gap between the second position-limiting structure and the second resilience arm.

In an embodiment, the first positioning structures of the sliding rail are concave structures, and the second positioning structure of the pressing part is a convex structure. A shape of each of the plural concave structures and a shape of the convex structure match each other.

In an embodiment, when the locking part is positioned at one of the plural positions, the locking part is locked on the expansion card. Consequently, the expansion card is fixed between the expansion port and the locking part.

In an embodiment, the electronic device is a multifunction docking station, and the expansion card is a solid state drive module.

From the above descriptions, the present invention provides the fixing device. The fixing device comprises the supporting base, the fastening element and the actuating element. The supporting base comprises the sliding rail. The fastening element is slidable relative to the sliding rail. The actuating element can drive the movement of the fastening element and position the fastening element. Due to the structural design of the fixing device, the user can easily and quickly fix the expansion card with a diversified size in the electronic device or detach the expansion card from the electronic device without the need of using any tool. Consequently, the problems of using screws to fix the expansion card can be overcome. In other words, the fixing device of the present invention is user-friendly. Moreover, the expansion card is directly placed on the supporting base and overlapped with the sliding rail. Due to this configuration, the occupied space of the fixing device in the electronic device is reduced, and the space utilization of the electronic device is largely increased.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
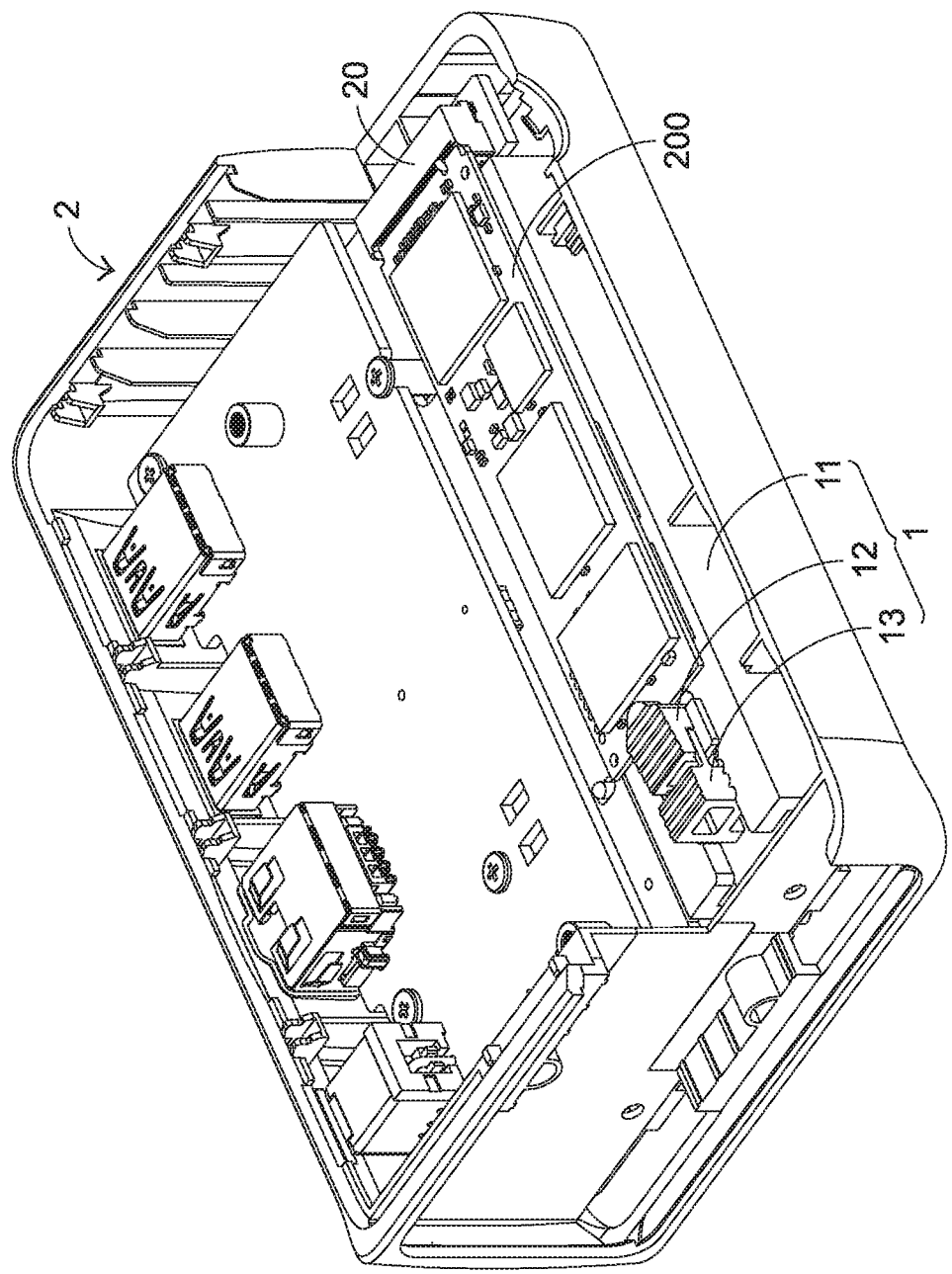
FIG. 1 is a schematic perspective view illustrating the appearance of a fixing device for fixing an expansion card in an electronic device.
Figure 2:
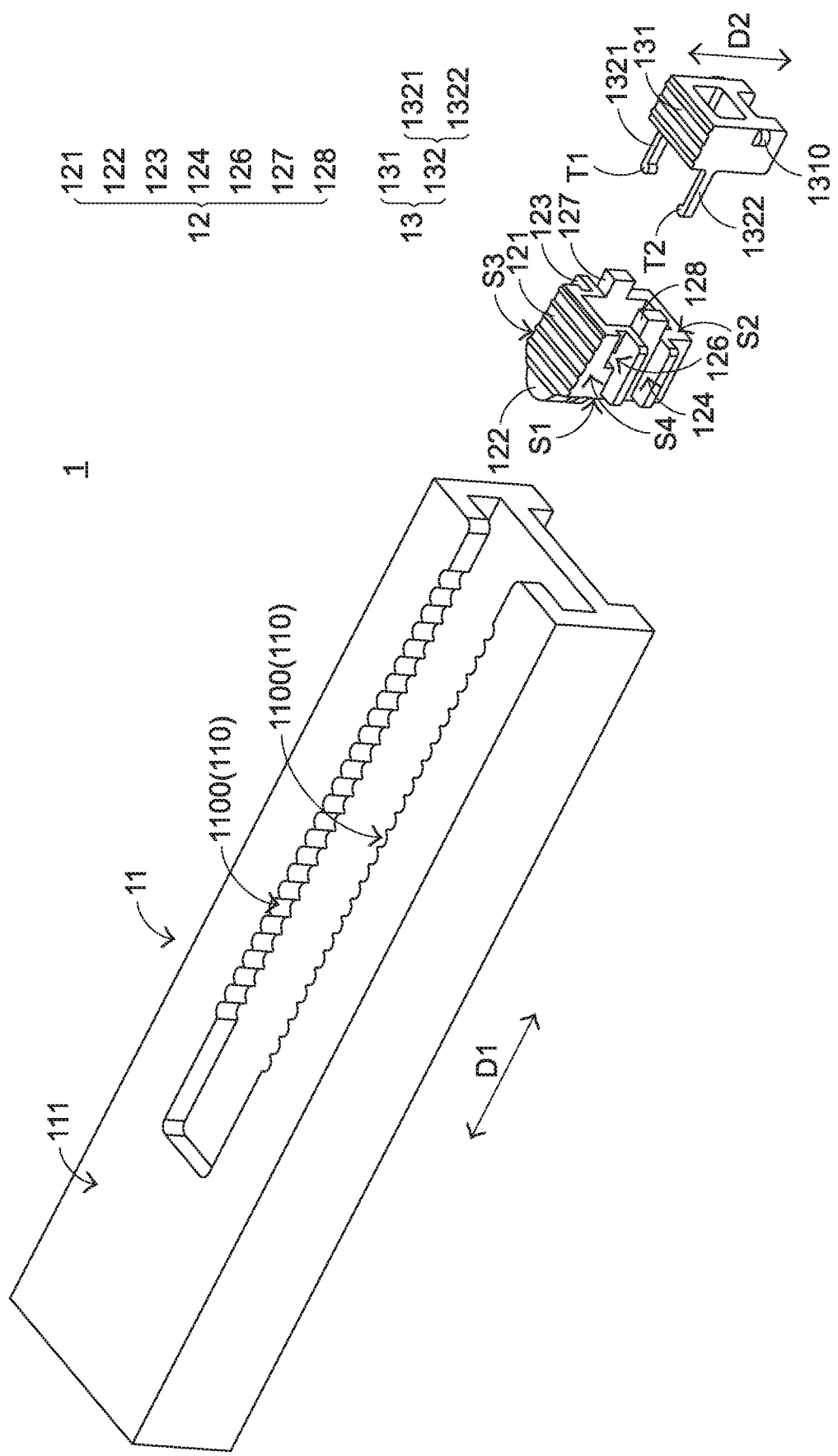
FIG. 2 is a schematic exploded view illustrating the fixing device as shown in FIG. 1 and taken along a viewpoint.
Figure 3:
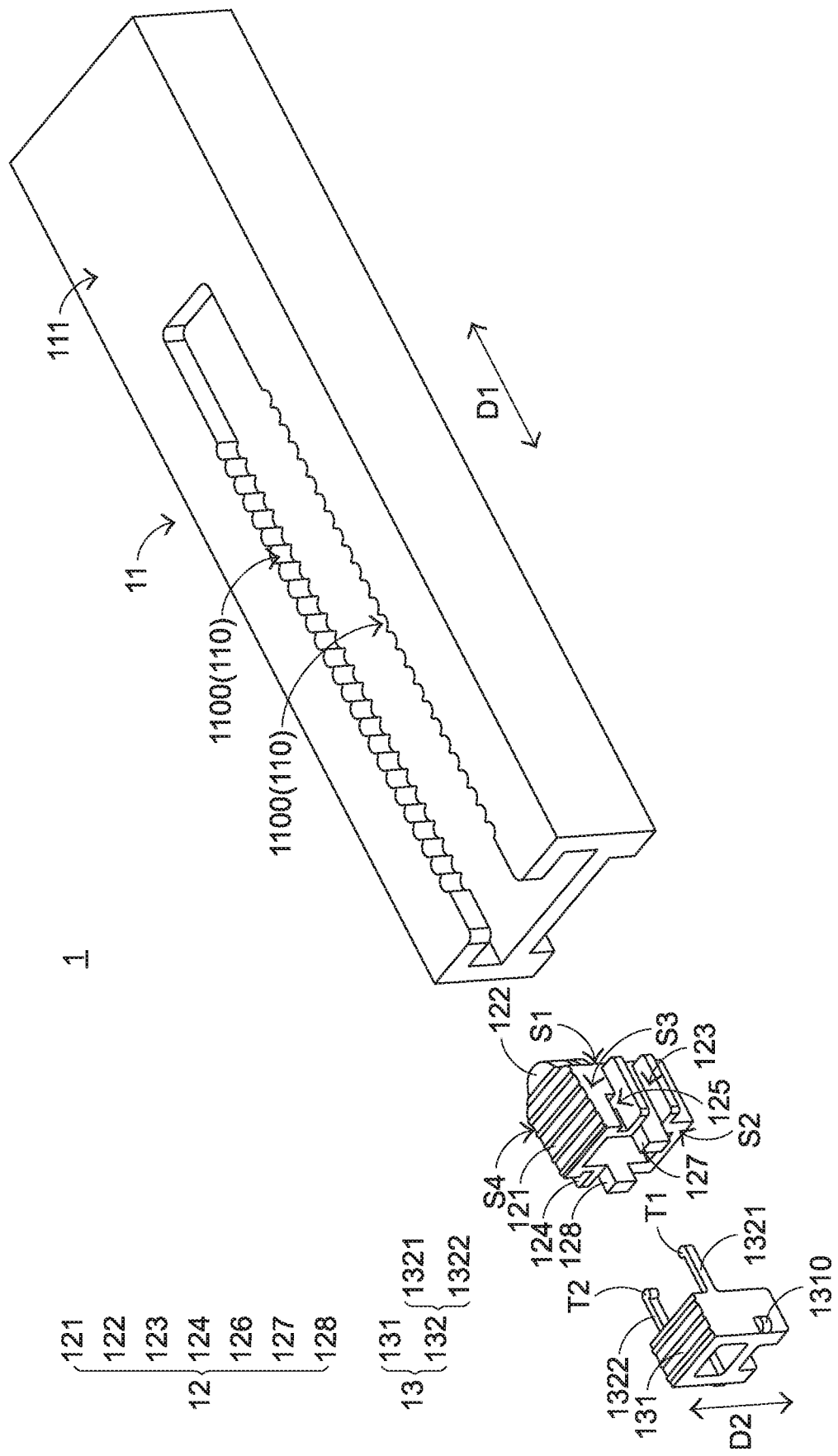
FIG. 3 is a schematic exploded view illustrating the fixing device as shown in FIG. 1 and taken along another viewpoint.
Figure 4:
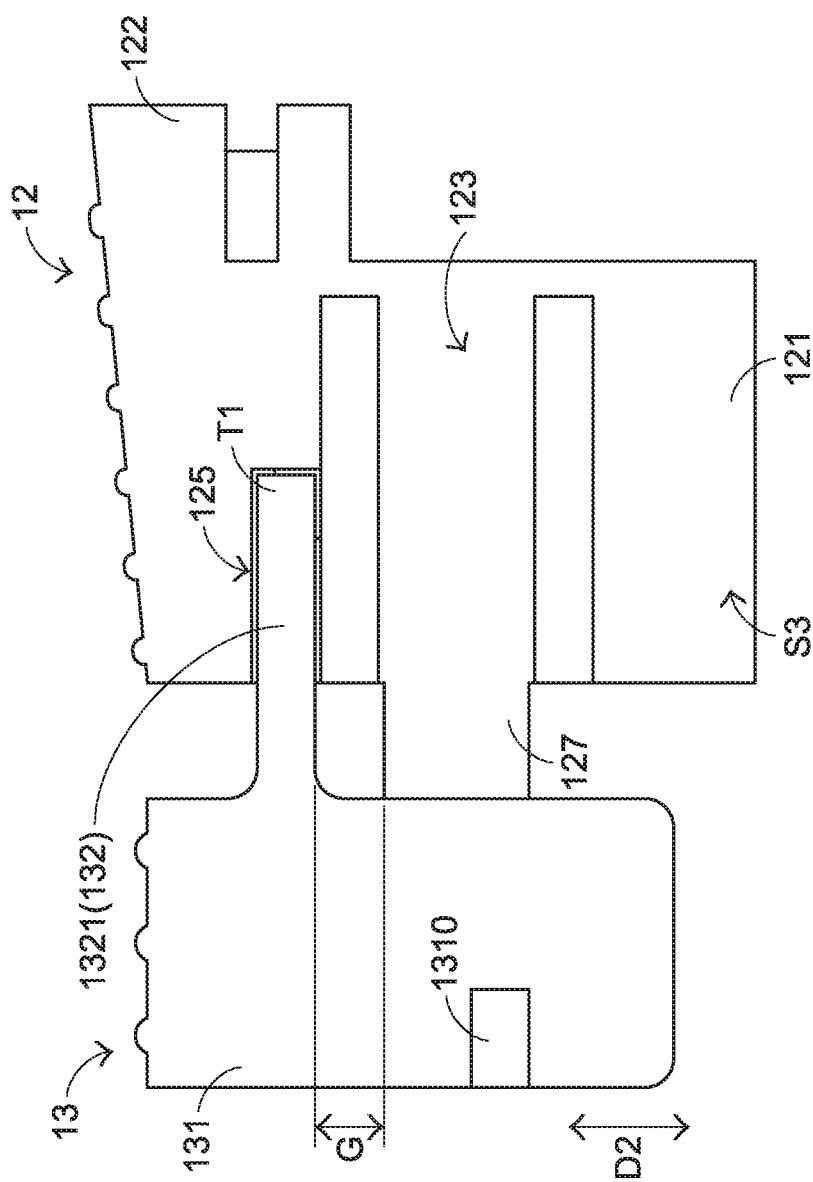
FIG. 4 is a schematic side view illustrating the assembled structure of a fastening element and an actuating element of the fixing device as shown in FIG. 1.

Please refer to FIGS. 1, 2, 3 and 4. FIG. 1 is a schematic perspective view illustrating the appearance of a fixing device for fixing an expansion card in an electronic device. FIG. 2 is a schematic exploded view illustrating the fixing device as shown in FIG. 1 and taken along a viewpoint. FIG. 3 is a schematic exploded view illustrating the fixing device as shown in FIG. 1 and taken along another viewpoint. FIG. 4 is a schematic side view illustrating the assembled structure of a fastening element and an actuating element of the fixing device as shown in FIG. 1.

As shown in FIG. 1, the fixing device 1 is disposed within an electronic device 2. When an expansion card 200 is plugged into an expansion port 20 of the electronic device 2, the expansion card 200 is fixed by the fixing device 1. In an embodiment, the electronic device 2 is a multifunction docking station, and the expansion card 200 is a solid state drive (SSD) module. It is noted that the types of the electronic device and the expansion card are not restricted.

The fixing device 1 of the present invention will be described in more details as follows.

Please refer to FIGS. 1, 2, 3 and 4 again. In this embodiment, the fixing device 1 comprises a supporting base 11, a fastening element 12 and an actuating element 13. The supporting base 11 is used for supporting the expansion card 200. The supporting base 11 comprises a sliding rail 110. When the expansion card 200 is placed on the supporting base 11, the sliding rail 110 is located under the expansion card 200. The sliding rail 110 comprises plural first positioning structures 1100. The fastening element 12 is movably installed on the sliding rail 110 of the supporting base 11. In addition, the expansion card 200 is arranged between the fastening element 12 and the expansion port 20. The actuating element 13 is detachably installed on the fastening element 12. In addition, the fastening element 12 is arranged between the actuating element 13 and the expansion port 20. As the actuating element 13 is moved, the fastening element 12 is correspondingly moved along the sliding rail 110 and relative to the supporting base 11 in the direction toward or away from the expansion port 20. Consequently, the fastening element 12 can be positioned at any position of the sliding rail 110.

Please refer to FIGS. 1, 2, 3 and 4 again. In this embodiment, the fastening element 12 comprises a sliding part 121 and a locking part 122. The sliding part 121 is movably installed on the sliding rail 110 of the supporting base 11. The sliding part 121 has a first side 51 and a second side S2, which are opposed to each other. The locking part 122 is protruded from the first side 51 of the sliding part 121. The expansion card 200 is arranged between the locking part 122 and the expansion port 20.

Please refer to FIGS. 1, 2, 3 and 4 again. In this embodiment, the actuating element 13 comprises a pressing part 131 and an elastic part 132. The pressing part 131 is detachably connected with the sliding part 121 of the fastening element 12 through the elastic part 132. In other words, the pressing part 131 is installed on and aligned with the second side S2 of the sliding part 121 of the fastening element 12. The pressing part 131 comprises at least one second positioning structure 1310. In this embodiment, the at least one second positioning structure 1310 includes two second positioning structures 1310. The two second positioning structures 1310 are formed on two opposite sides of the pressing part 131, respectively. It is noted that the number of the at least one second positioning structure 1310 is not restricted.

As the pressing part 131 of the actuating element 13 is moved, the sliding part 121 of the fastening element 12 is correspondingly moved along the sliding rail 110 of the supporting base 11 and relative to the supporting base 11 in the direction toward or away from the expansion port 20. That is, as the pressing part 131 is moved, the sliding part 121 is slidable back and forth along a first axial direction D1. As the sliding part 121 is slid, the locking part 122 is correspondingly slid between plural positions. Moreover, the pressing part 131 of the actuating element 13 can be swung relative to the sliding part 121 of the fastening element 12 through the elastic part 132. That is, the pressing part 131 of the actuating element 13 can be swung upwardly or downwardly relative to the sliding part 121 of the fastening element 12 along a second axial direction D2. In this way, the second positioning structure 1310 of the pressing part 131 is detachably engaged with one of the first positioning structures 1100 of the sliding rail 110. Consequently, the locking part 122 can be positioned at the target position.

In this embodiment, the first positioning structures 1100 of the sliding rail 110 are concave structures, and the second positioning structures 1310 of the pressing part 131 are convex structures. The shape of the concave structure and the shape of the convex structure match each other. It is noted that the shapes of the first positioning structures 1100 and the second positioning structures 1310 are not restricted. For example, in another embodiment, the first positioning structures 1100 are convex structures, and the second positioning structures 1310 are concave structures.

Please refer to FIGS. 1, 2 and 3 again. In this embodiment, the supporting base 11 further comprises a supporting surface 111. The supporting surface 111 of the supporting base 11 is used for supporting the expansion card 200. The sliding rail 110 and the supporting surface 111 are located beside each other. In this embodiment, a portion of the expansion card 200 is directly placed on the supporting surface 111, and another portion of the expansion card 200 is overlapped with the sliding rail 110. Due to this configuration, the occupied space of the fixing device 1 in the electronic device 2 is reduced, and the space utilization of the electronic device 2 is largely increased.

Please refer to FIGS. 2, 3 and 4 again. In this embodiment, the fastening element 12 further comprises a first guiding recess 123 and a second guiding recess 124. Moreover, the sliding part 121 further has a third side S3 and a fourth side S4, which are opposed to each other. The third side S3 and the fourth side S4 of the sliding part 121 are arranged between the first side 51 and the second side S2. The first guiding recess 123 is formed in the third side S3 of the sliding part 121. In addition, a first lateral structure of the sliding rail 110 is accommodated within the first guiding recess 123. The second guiding recess 124 is formed in the fourth side S4 of the sliding part 121. In addition, a second lateral structure of the sliding rail 110 is accommodated within the second guiding recess 124. Due to the guidance of the first guiding recess 123 and the second guiding recess 124, the sliding part 121 of the fastening element 12 is movable along the sliding rail 110 and relative to the supporting base 11 in the direction toward or away from the expansion port 20.

Please refer to FIGS. 2, 3 and 4 again. In this embodiment, the fastening element 12 further comprises a first engaging recess 125 and a second engaging recess 126. The first engaging recess 125 is concavely formed in the third side S3 of the sliding part 121 and located over the first guiding recess 123. The second engaging recess 126 is concavely formed in the fourth side S4 of the sliding part 121 and located over the second guiding recess 124.

In this embodiment, the elastic part 132 of the actuating element 13 comprises a first resilient arm 1321 and a second resilience arm 1322. The first resilient arm 1321 is protruded from a first end of the pressing part 131 and extended in the direction toward the sliding part 121. In addition, a first tenon T1 of the first resilient arm 1321 is engaged with the first engaging recess 125. The second resilience arm 1322 is protruded from a second end of the pressing part 131 and extended in the direction toward the sliding part 121. In addition, a second tenon T1 of the second resilience arm 1322 is engaged with the second engaging recess 126.

When an external force is applied to the pressing part 131 by the user, the pressing part 131 is swung downwardly relative to the sliding part 121 along the second axial direction D2. As the pressing part 131 is swung downwardly, the first resilient arm 1321 and the second resilience arm 1322 of the elastic part 132 are subjected to downward curvy deformation. In addition, the second positioning structures 1310 of the pressing part 131 are disengaged from the corresponding positioning structures 1100 of the sliding rail 110. When the external force applied to the pressing part 131 is released, the pressing part 131 is swung upwardly relative to the sliding part 121 along the second axial direction D2 in response to the elastic restoring forces of the first resilient arm 1321 and the second resilience arm 1322 of the elastic part 132. Consequently, the second positioning structures 1310 of the pressing part 131 are engaged with the corresponding positioning structures 1100 of the sliding rail 110.

Please refer to FIGS. 2, 3 and 4 again. In this embodiment, the fastening element 12 further comprises a first position-limiting structure 127 and a second position-limiting structure 128. The first position-limiting structure 127 is protruded from a first end of the second side S2 of the sliding part 121 and extended in the direction toward the pressing part 131. Moreover, the first position-limiting structure 127 is located under the first resilient arm 1321. The second position-limiting structure 128 is protruded from a second end of the second side S2 of the sliding part 121 and extended in the direction toward the pressing part 131. Moreover, the second position-limiting structure 128 is located under the second resilience arm 1322.

Due to the first position-limiting structure 127 and the second position-limiting structure 128, the deformation amounts of the first resilient arm 1321 and the second resilience arm 1322 of the elastic part 132 are controllable. Since the deformation amounts of the first resilient arm 1321 and the second resilience arm 1322 are not too large, the first resilient arm 1321 and the second resilience arm 1322 will not be broken. For example, when the external force is applied to the pressing part 131 by the user, the pressing part 131 is correspondingly moved downwardly and the first resilient arm 1321 and the second resilience arm 1322 of the elastic part 132 are subjected to the downward curvy deformation. When the first resilient arm 1321 and the second resilience arm 1322 are respectively contacted with the first position-limiting structure 127 and the second position-limiting structure 128, the first resilient arm 1321 and the second resilience arm 1322 are no longer subjected to the downward curvy deformation.

In this embodiment, there is a gap G between the first position-limiting structure 127 and the first resilient arm 1321, and there is another gap G between the second position-limiting structure 128 and the second resilience arm 1322. The deformation amounts of the first resilient arm 1321 and the second resilience arm 1322 are determined according to the magnitude of the gap G It is noted that the magnitude of the gap G is not restricted. The magnitude of the gap G may be determined according to the practical requirements.

Figure 5A:
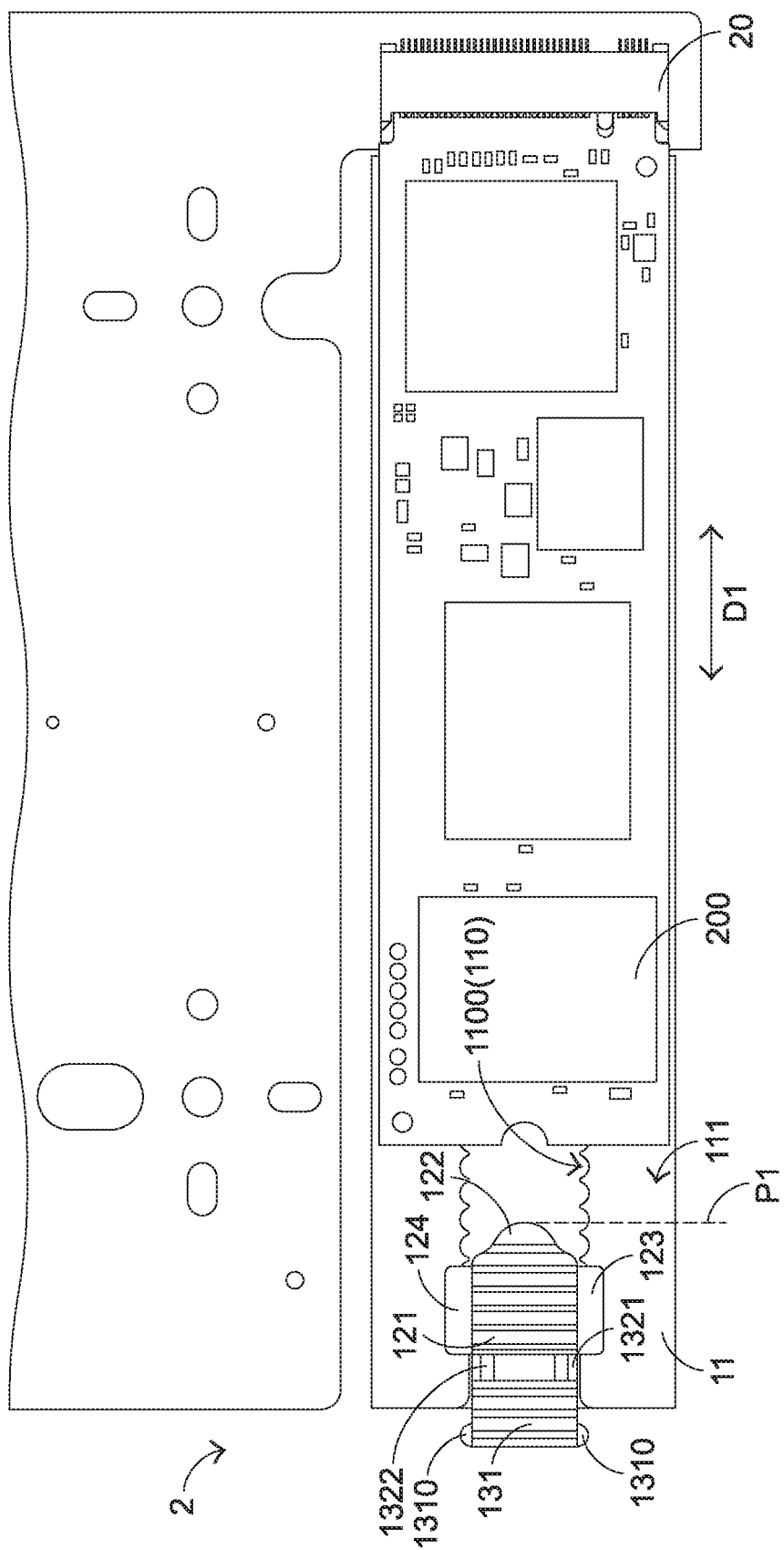
FIGS. 5A, 5B and 5C schematically illustrate the operations of the fixing device according to the embodiment of the present invention.
Figure 5B:
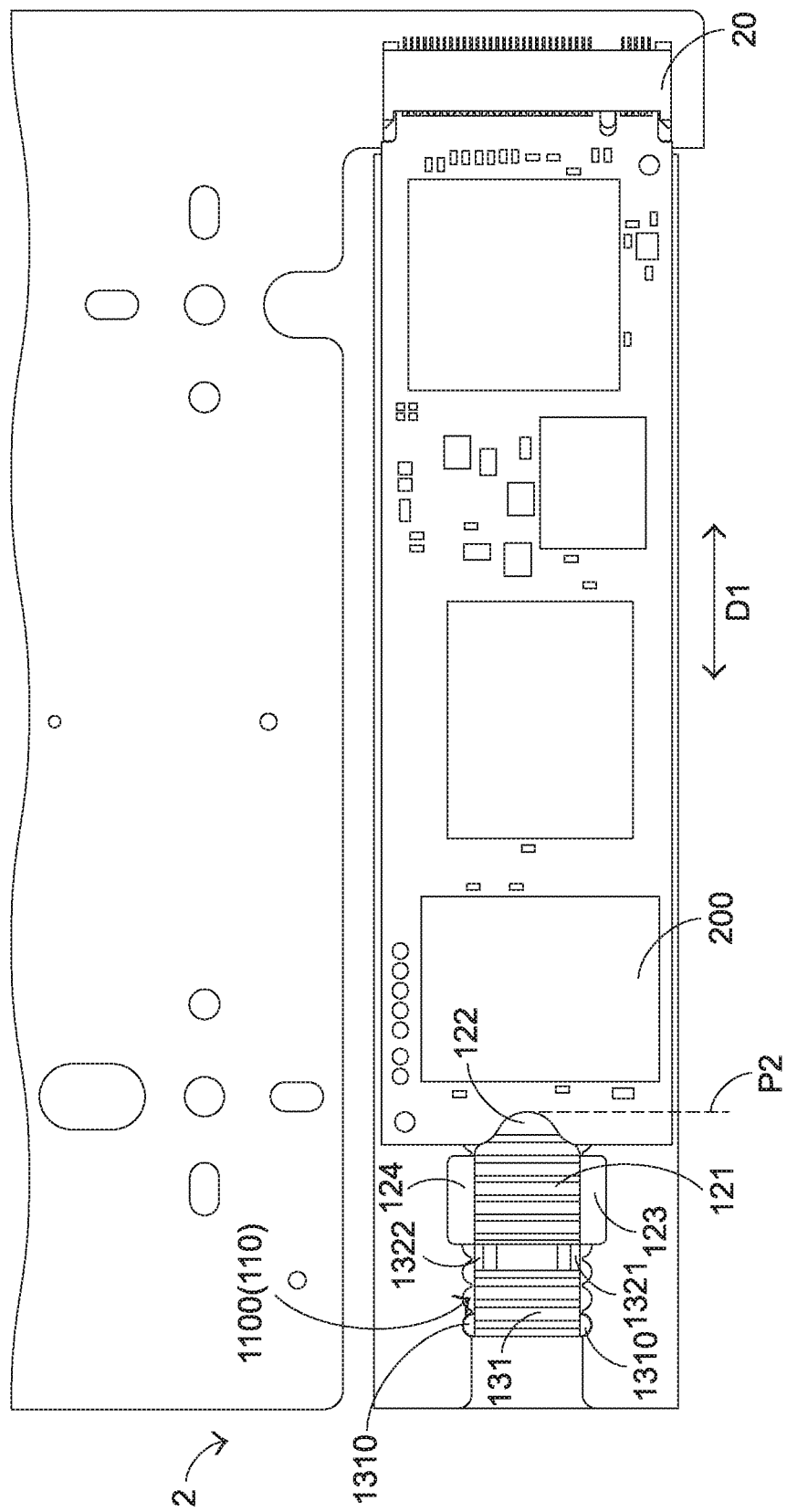
Figure 5C:
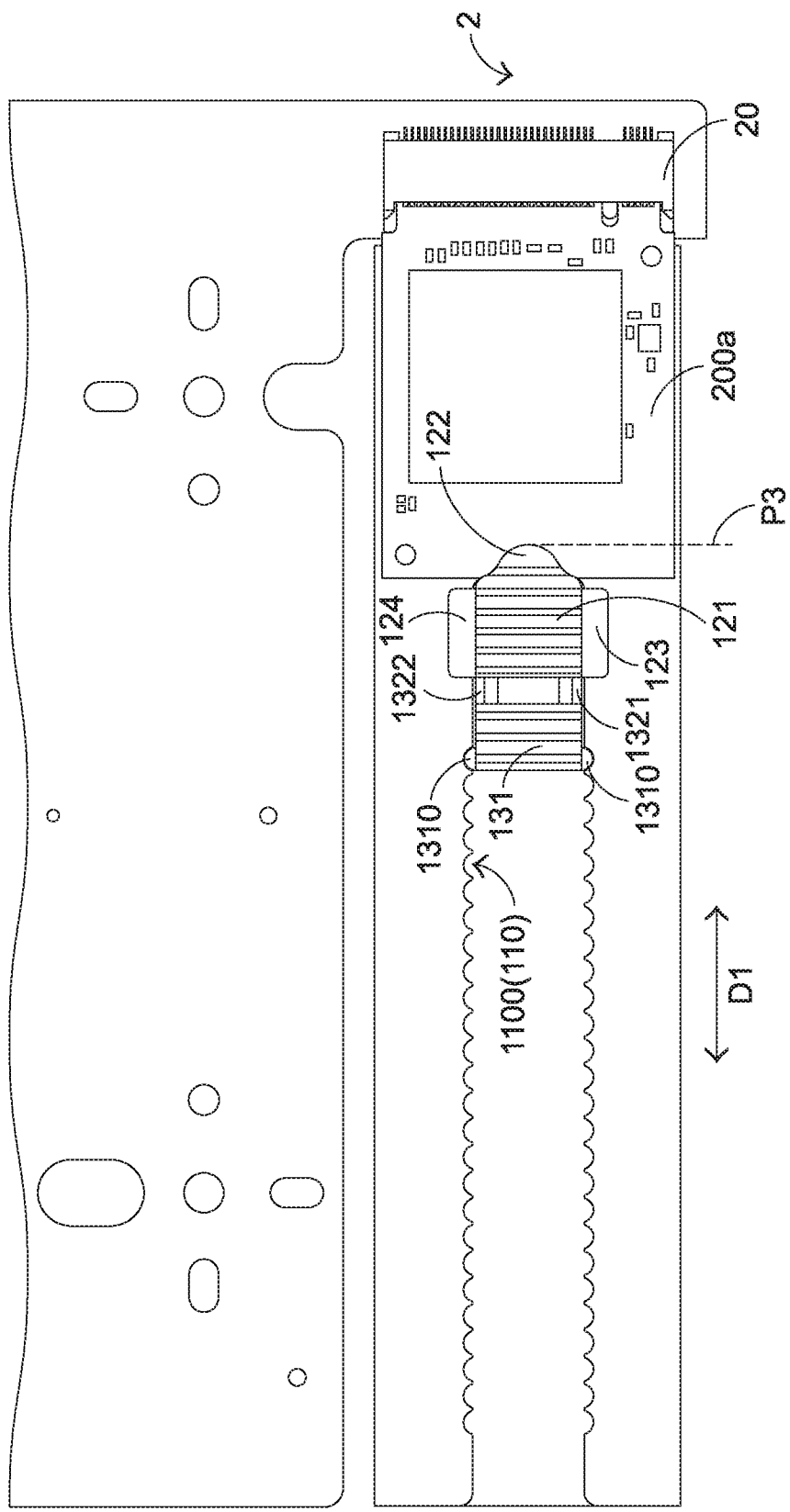

FIGS. 5A, 5B and 5C schematically illustrate the operations of the fixing device according to the embodiment of the present invention. The operations of the fixing device 1 will be described in more details as follows.

Please refer to FIGS. 5A and 5B and also FIGS. 1, 2, 3 and 4. In case that the user intends to fix the expansion card 200 (e.g., Type 22110 expansion card according to the specification) in the electronic device 2, the following steps are performed. Firstly, as shown in FIG. 5A, the pressing part 131 of the actuating element 13 is pressed by the user, and the pressing part 131 is swung downwardly relative to the sliding part 121 along the second axial direction D2 through the elastic part 132. Consequently, the second positioning structures 1310 of the pressing part 131 are disengaged from the corresponding positioning structures 1100 of the sliding rail 110. Then, as shown in the pressing part 131 is pushed in the direction away from the expansion port 20 (i.e., along the first axial direction D1) by the user, the sliding part 121 of the fastening element 12 is correspondingly moved along the sliding rail 110 of the supporting base 11 in the direction away from the expansion port 20. As the sliding part 121 is moved, the locking part 122 is correspondingly moved to a position P1. When the external force applied to the pressing part 131 is released, the pressing part 131 is swung upwardly relative to the sliding part 121 in response to the elastic restoring force of the elastic part 132. Consequently, the second positioning structures 1310 of the pressing part 131 are engaged with the positioning structures 1100 corresponding to the position P1, and the locking part 122 is positioned at the position P1. Then, the expansion card 200 is plugged into the expansion port 20.

Please refer to FIG. 5B. Then, the pressing part 131 of the actuating element 13 is pressed by the user. Consequently, the second positioning structures 1310 of the pressing part 131 are disengaged from the positioning structures 1100 corresponding to the position P1. Then, as the pressing part 131 is pushed in the direction toward the expansion port 20 by the user, the sliding part 121 of the fastening element 12 is correspondingly moved along the sliding rail 110 in the direction toward the expansion port 20. As the sliding part 121 is moved, the locking part 122 is correspondingly moved to a position P2 and locked on the expansion card 200. When the external force applied to the pressing part 131 is released, the second positioning structures 1310 of the pressing part 131 are engaged with the positioning structures 1100 corresponding to the position P2, and the locking part 122 is positioned at the position P2. Meanwhile, the expansion card 200 is fixed between the expansion port 20 and the locking part 122.

Please refer to FIG. 5C and also FIGS. 1, 2, 3 and 4. In case that the user intends to fix an expansion card 200a with a different size (e.g., Type 2230 expansion card according to the specification) in the electronic device 2, the following steps are performed. Firstly, the procedure as shown in FIG. 5A is performed. Consequently, the locking part 122 is positioned at the position P1. Then, the locking part 122 is detached from the expansion card 200 (e.g., Type 22110 expansion card according to the specification), and the expansion card 200 is removed from the fixing device 1. After the expansion card 200a (e.g., Type 2230 expansion card according to the specification) is plugged into the expansion port 20, the procedure as shown in FIG. 5B is performed. Then, the locking part 122 is positioned at a position P3 and locked on the expansion card 200a. Meanwhile, the expansion card 200a is fixed between the expansion port 20 and the locking part 122.

It is noted that the expansion cards are not restricted to the Type 22110 expansion card and the Type 2230 expansion card. For example, the fixing device 1 can be also used to fix the Type 2242 expansion card, the Type 2260 expansion card, the Type 2280 expansion card or any other appropriate expansion card in the electronic device 2. That is, the specifications of the expansion card for the fixing device 1 of the present invention are not restricted.

From the above descriptions, the present invention provides the fixing device. The fixing device comprises the supporting base, the fastening element and the actuating element. The supporting base comprises the sliding rail. The fastening element is slidable relative to the sliding rail. The actuating element can drive the movement of the fastening element and position the fastening element. Due to the structural design of the fixing device, the user can easily and quickly fix the expansion card with a diversified size in the electronic device or detach the expansion card from the electronic device without the need of using any tool. Consequently, the problems of using screws to fix the expansion card can be overcome. In other words, the fixing device of the present invention is user-friendly. Moreover, the expansion card is directly placed on the supporting base and overlapped with the sliding rail. Due to this configuration, the occupied space of the fixing device in the electronic device is reduced, and the space utilization of the electronic device is largely increased.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A fixing device for fixing an expansion card in an electronic device, the electronic device comprising an expansion port, the fixing device comprising:
   a supporting base that supports the expansion card and comprises a sliding rail, wherein the sliding rail is located under the expansion card, and the sliding rail comprises plural first positioning structures;
   a fastening element comprising a sliding part and a locking part, wherein the sliding part is movably installed on the sliding rail, and the sliding part has a first side and a second side opposite to the first side, wherein the locking part is protruded from the first side of the sliding part, and the expansion card is arranged between the locking part and the expansion port, wherein the fastening element further comprises a first guiding recess and a second guiding recess, and the sliding part further has a third side and a fourth side, wherein the third side and the fourth side are opposed to each other, and the third side and the fourth side are arranged between the first side and the second side, wherein the first guiding recess is formed in the third side of the sliding part, a first lateral of the sliding rail is accommodated within the first guiding recess, the second guiding recess is formed in the fourth side of the sliding part, and a second lateral structure of the sliding rail is accommodated within the second guiding recess, wherein the sliding part is movable along the sliding rail and relative to the supporting base in the direction toward or away from the expansion port through guidance of the first guiding recess and the second guiding recess; and
   an actuating element comprising a pressing part and an elastic part, wherein the pressing part is connected with the sliding part through the elastic part, the pressing part is aligned with the second side of the sliding part, and the pressing part comprises at least one second positioning structure,
   wherein as the pressing part is moved, the sliding part is correspondingly slid along the sliding rail and relative to the supporting base in a direction toward or away from the expansion port, wherein as the sliding part is slid, the locking part is correspondingly slid between plural positions, wherein the pressing part is permitted to be swung relative to the sliding part through the elastic part, and the at least one second positioning structure is detachably engaged with one of the plural first positioning structures, so that the locking part is positioned at one of the plural positions, wherein the fastening element further comprises a first engaging recess and a second engaging recess, and the elastic part of the actuating element comprises a first resilient arm and a second resilience arm, wherein the first engaging recess is concavely formed in the third side of the sliding part, and the second engaging recess is concavely formed in the fourth side of the sliding part, wherein the first resilient arm is protruded from a first end of the pressing part and extended in a direction toward the sliding part, and a first tenon of the first resilient arm is engaged with the first engaging recess wherein the second resilience arm is protruded from a second end of the pressing part and extended in the direction toward the sliding part and a second tenon of the second resilience arm is engaged with the second engaging recess.

2. The fixing device according to claim 1, wherein the supporting base further comprises a supporting surface, wherein the expansion card is supported on the supporting surface, and the sliding rail and the supporting surface are located beside each other.

3. The fixing device according to claim 1, wherein the fastening element further comprises a first position-limiting structure and a second position-limiting structure, wherein the first position-limiting structure is protruded from a first end of the second side of the sliding part and extended in a direction toward the pressing part, and the first position-limiting structure is located under the first resilient arm, wherein the second position-limiting structure is protruded from a second end of the second side of the sliding part and extended in the direction toward the pressing part, and the second position-limiting structure is located under the second resilience arm.

4. The fixing device according to claim 3, wherein there is a gap between the first position-limiting structure and the first resilient arm, and there is another gap between the second position-limiting structure and the second resilience arm.

5. The fixing device according to claim 1, wherein the first positioning structures of the sliding rail are concave structures, and the second positioning structure of the pressing part is a convex structure, wherein a shape of each of the plural concave structures and a shape of the convex structure match each other.

6. The fixing device according to claim 1, wherein when the locking part is positioned at one of the plural positions, the locking part is locked on the expansion card, so that the expansion card is fixed between the expansion port and the locking part.

7. The fixing device according to claim 1, wherein the electronic device is a multifunction docking station, and the expansion card is a solid state drive module.

* * * * *